(12) United States Patent
Greeley et al.

(10) Patent No.: US 8,241,944 B2
(45) Date of Patent: Aug. 14, 2012

(54) RESISTIVE RAM DEVICES AND METHODS

(75) Inventors: Joseph N. Greeley, Boise, ID (US);
John A. Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/830,079

(22) Filed: Jul. 2, 2010

(65) Prior Publication Data

US 2012/0001144 A1 Jan. 5, 2012

(51) Int. Cl.
*H01L 21/00* (2006.01)
(52) U.S. Cl. .............. 438/95; 438/104; 438/130; 257/4; 257/43; 257/E21.586
(58) Field of Classification Search .................. None
See application file for complete search history.

(56) References Cited

U.S. PATENT DOCUMENTS

| | | | | |
|---|---|---|---|---|
| 5,476,814 | A * | 12/1995 | Ohshima et al. | .............. 438/641 |
| 7,668,002 | B2 | 2/2010 | Kinoshita et al. | |
| 2005/0110145 | A1* | 5/2005 | Elers | .............. 257/758 |
| 2006/0009034 | A1* | 1/2006 | Lai et al. | .............. 438/680 |
| 2007/0202677 | A1 | 8/2007 | Mathew et al. | |
| 2007/0218665 | A1 | 9/2007 | Sutardja et al. | |
| 2008/0041725 | A1 | 2/2008 | Klein et al. | |
| 2008/0049487 | A1* | 2/2008 | Yoshimura et al. | .............. 365/148 |
| 2008/0054243 | A1 | 3/2008 | Shima et al. | |
| 2008/0083946 | A1* | 4/2008 | Fang et al. | .............. 257/324 |
| 2008/0173931 | A1 | 7/2008 | Ho et al. | |
| 2008/0304312 | A1* | 12/2008 | Ho et al. | .............. 365/148 |
| 2009/0095985 | A1 | 4/2009 | Lee et al. | |
| 2009/0109598 | A1 | 4/2009 | Avanzino et al. | |
| 2009/0279343 | A1* | 11/2009 | Chang et al. | .............. 365/148 |
| 2009/0302302 | A1 | 12/2009 | Heo et al. | |
| 2009/0309690 | A1 | 12/2009 | Kinoshita et al. | |
| 2010/0051577 | A1 | 3/2010 | Rueger | |
| 2010/0051896 | A1 | 3/2010 | Park et al. | |
| 2010/0054014 | A1 | 3/2010 | Lee et al. | |
| 2011/0108517 | A1* | 5/2011 | Luong et al. | .............. 216/6 |

FOREIGN PATENT DOCUMENTS

KR 10-2009-0070780 A 7/2009

OTHER PUBLICATIONS

I. G. Baek, et al. Highly Scalable Non-volatile Resistive Memory using Simple Binary Oxide Driven by Asymmetric Unipolar Voltage Pulses. Downloaded Mar. 31, 2010 from IEEE. (4 pgs.).

(Continued)

*Primary Examiner* — Kyoung Lee
(74) *Attorney, Agent, or Firm* — Brooks, Cameron & Huebsch, PLLC

(57) ABSTRACT

The present disclosure includes a high density resistive random access memory (RRAM) device, as well as methods of fabricating a high density RRAM device. One method of forming an RRAM device includes forming a resistive element having a metal-metal oxide interface. Forming the resistive element includes forming an insulative material over the first electrode, and forming a via in the insulative material. The via is conformally filled with a metal material, and the metal material is planarized to within the via. A portion of the metal material within the via is selectively treated to create a metal-metal oxide interface within the via. A second electrode is formed over the resistive element.

20 Claims, 7 Drawing Sheets

OTHER PUBLICATIONS

Dmitri B. Strukov, et al. "The missing memristor found". Nature. vol. 453. May 1, 2008. (pg. 80-83).

Y. C. Chen, et al. "Ultra-Thin Phase-Change Bridge Memory Device Using GeSb". IEEE 2006. (4 pgs.).

An Chen. "Ionic Memories: Status and Challenges". Downloaded on Mar. 30, 2010 from IEEE. (5 pgs.).

An Chen, et al. "Non-Volatile Resistive Switching for Advanced Memory Applications" IEEE 2005. (4 pgs.).

Y. Hosoi, et al. "High Speed Unipolar Switching Resistance RAM (RRAM) Technology". IEEE 2006 (4 pgs.).

Sung Hyun Jo, et al. "High-Density Crossbar Arrays Based on a Si Memristive System". NANO Letters. Downloaded from http://pubs.acs.org on Jan. 21, 2009. (6 pgs.).

John A. Smythe, III, et al. "GCIB-Treated Resistive Device" U.S. Appl. No. 12/693,936, filed Jan. 26, 2010. (40 pgs.).

International Search Report and Written Opinion for related PCT Application No. PCT/US2011/001160 dated Feb. 20, 2012 (9 pp.).

* cited by examiner

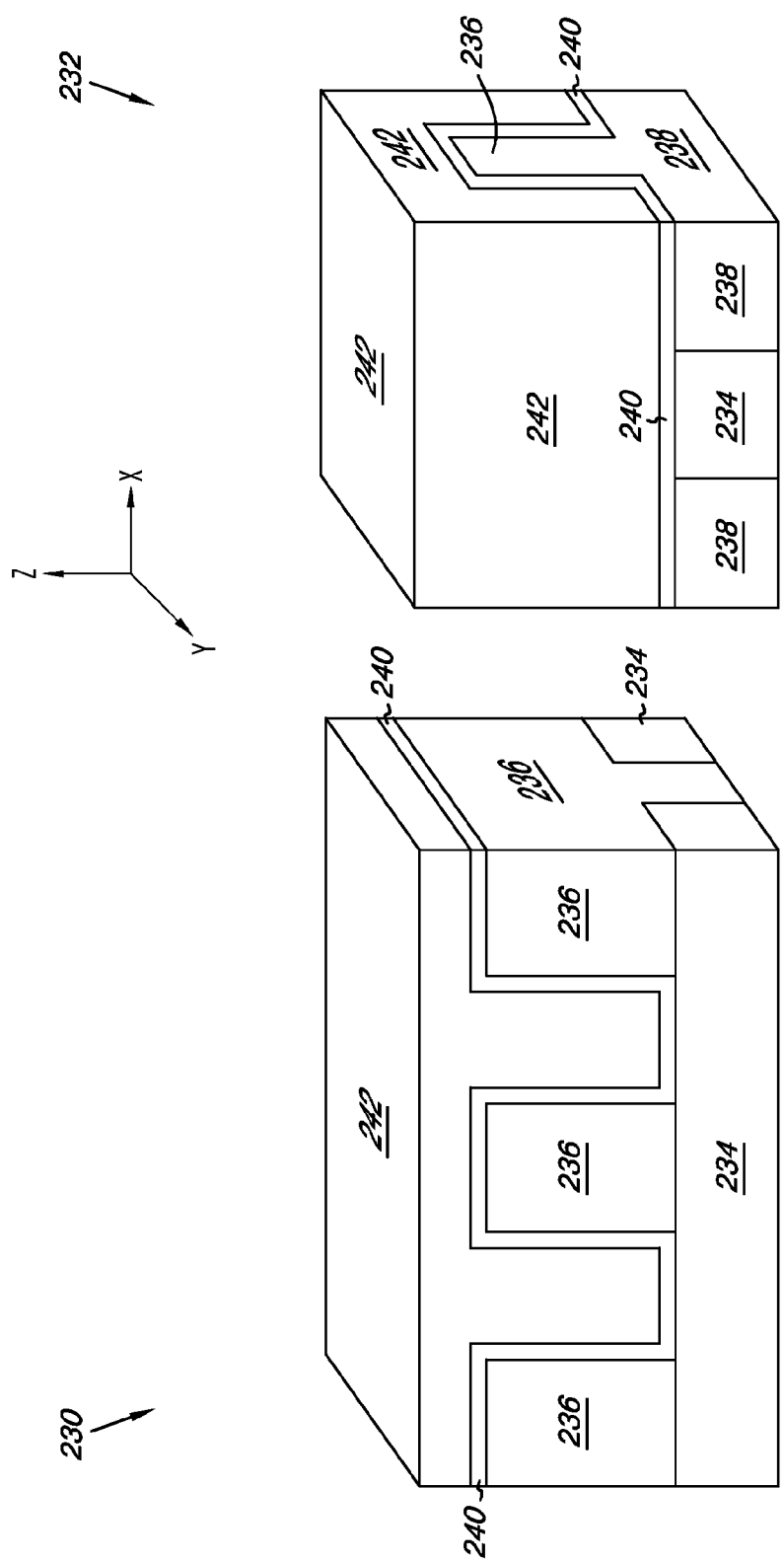

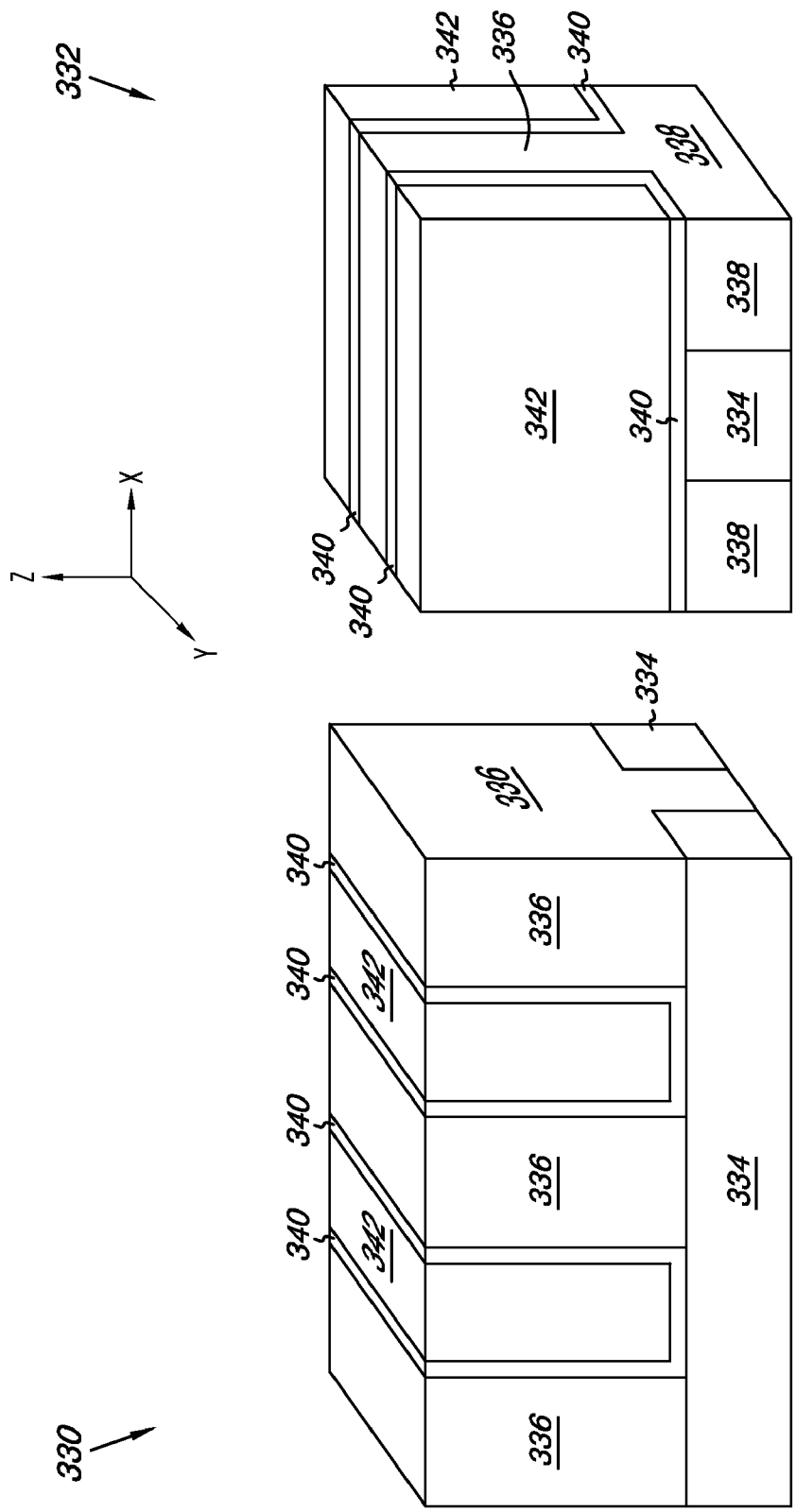

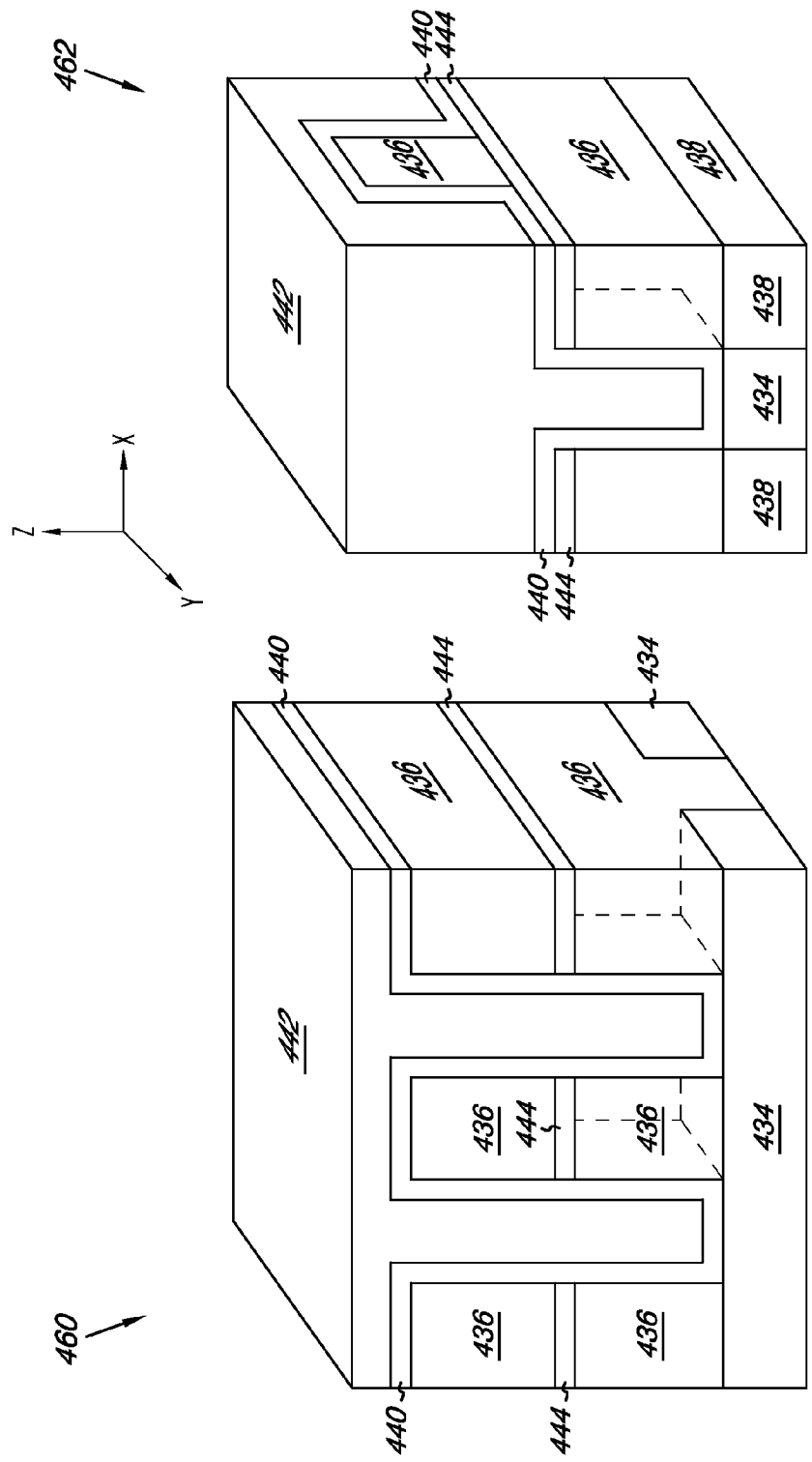

RESISTIVE RAM DEVICES AND METHODS

TECHNICAL FIELD

The present disclosure relates generally to semiconductor memory devices, methods, and systems, and more particularly, to resistive random access memory (RRAM) devices and methods.

BACKGROUND

Resistive elements can be used as semiconductor switches or memory elements (e.g., memory cells of a memory device), among other applications. Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, resistance variable memory such as phase change random access memory (PCRAM), and resistive random access memory (RRAM), among others.

In modern semiconductor device applications, numerous components are packed onto a single small area, for instance, on a semiconductor substrate, to create an integrated circuit. As the size of integrated circuits is reduced, the components and devices that make up the circuits must be positioned closer together in order to comply with the limited space available. As the industry strives towards a greater density of active components per unit area, effective and accurate creation and isolation between circuit components becomes all the more important.

Memory devices are utilized as non-volatile memory for a wide range of electronic applications in need of high memory densities, high reliability, and low power consumption. Non-volatile memory may be used in a personal computer, a portable memory stick, a solid state drive (SSD), a personal digital assistant (PDA), a digital camera, a cellular telephone, a portable music player (e.g., MP3 player), a movie player, and other electronic devices, among others. Program code and system data, such as a basic input/output system (BIOS), are typically stored in non-volatile memory devices.

Non-volatile resistive memory such as RRAM devices store data by varying the resistance of a resistance element. RRAM devices can have certain beneficial characteristics over other types of memory devices, such as low power consumption, high speed, and excellent bit resolution due to separation and a relatively large resistance ratio between a high resistance state (FIRS) and a low resistance state (LRS), without the read/write cycle endurance limitations of charge-storage type memory.

Data may be written to a selected RRAM device by applying a predetermined voltage, at a predetermined polarity, for a predetermined duration. RRAM devices can be operated using two types switching: unipolar or bipolar. Unipolar switching involves programming and erasing using long and short pulses having the same voltage polarity. In contrast, bipolar switching uses short pulses, but programming and erasing pulses are of opposite polarity.

A variety of variable resistance materials have been employed in previous memory cell approaches, including STT-RAM utilizing spin torque characteristics, PCRAM involving the phase change of chalcogenides, Ag ionic transfer technologies, NiO, and copper ionic transport materials. However, many of the technologies of previous approaches do not appear to scale well. Patterning to smaller dimensions is not always possible, and etch damage in forming memory cells becomes a relatively larger problem as memory cell dimensions decrease.

Many previous approaches for implementing memory devices have primarily utilized semiconductor materials for the memory element, reserving the use of metals to that of contacts and conductors. Previous approaches involving the etching of metal can be hindered by poor metal etch rates, use of high processing temperatures, and the use of additional energy sources. These approaches are not practical for semiconductor batch processing of large substrates clue to poor etch uniformity, high cost, added equipment complexity, and reliability problems. These, and other, difficulties in using metals so as to achieve smaller feature dimensions have hindered the fabrication efforts of high density RRAM devices.

BRIEF DESCRIPTION OF THE DRAWINGS

FIGS. 2A and 2B illustrate a cross-sectional view of a semiconductor structure during the formation of an RRAM device using single damascene processing in accordance with one or more embodiments of the present disclosure.

FIGS. 3A and 3B illustrate a cross-sectional view of a semiconductor structure during the formation of an RRAM device using single damascene processing after planarization to isolate a bit line in accordance with one or more embodiments of the present disclosure.

FIGS. 4A and 4B illustrate a cross-sectional view of a semiconductor structure during the formation of an RRAM device using dual damascene processing in accordance with one or more embodiments of the present disclosure.

DETAILED DESCRIPTION

The present disclosure includes a resistive random access memory (RRAM) device, as well as methods of fabricating a RRAM device. One method of forming an RRAM device includes forming a resistive element having a metal-metal oxide interface. Forming the resistive element includes forming an insulative material over the first electrode, and forming a via in the insulative material. The via is conformally filled with a metal material, and the metal material is planarized to within the via. The metal fill may also be selective, or bottom up. A portion of the metal material within the via is selectively treated to create a metal-metal oxide interface within the via. A second electrode is formed over the resistive element.

In the following detailed description of the present disclosure, reference is made to the accompanying drawings that form a part hereof, and in which is shown by way of illustration how one or more embodiments of the disclosure may be practiced. These one or more embodiments are described in sufficient detail to enable those of ordinary skill in the art to practice the one or more embodiments of this disclosure, and it is to be understood that other embodiments may be utilized and that process, electrical, or mechanical changes my be made without departing from the scope of the present disclosure.

Figure 1:
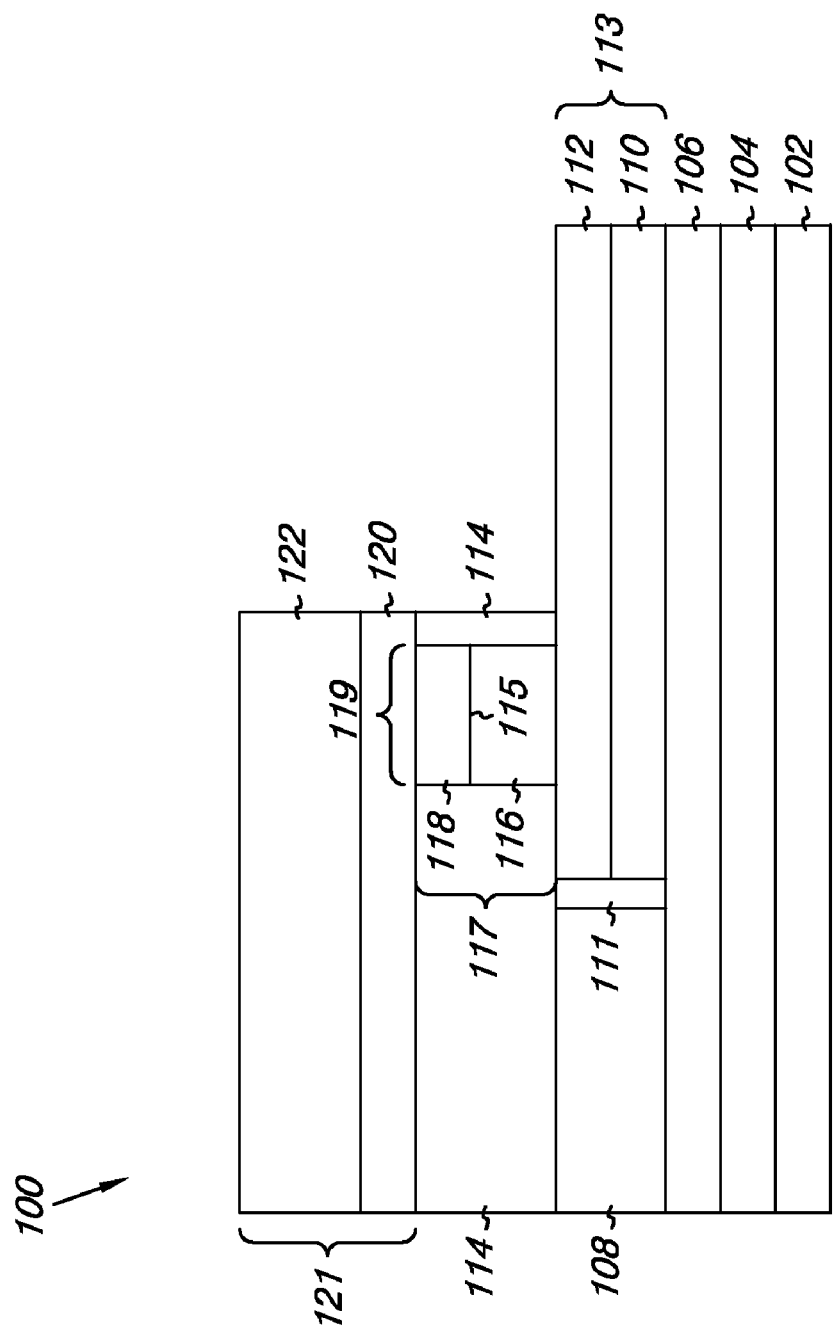
FIG. 1 illustrates a schematic cross-sectional view of an RRAM device in accordance with one or more embodiments of the present disclosure.

FIG. 1 illustrates a schematic cross-sectional view of an RRAM device in accordance with the present disclosure. According to one or more embodiments of the present disclosure, the structure illustrated in FIG. 1 is a sub-40 nm metal oxide (MOx) cell implemented as a two-terminal RRAM device. The two-terminal RRAM device can be fabricated by a process that includes a conformal metal fill of a via, planarization (e.g., CMP) isolation of conductors (e.g., lines), selective oxidation (e.g., to create an active area including a metal-metal oxide interface), and top electrode patterning. The method and structures of the present disclosure include resistive elements fabricated having TiN—TiON and Cu—CuOx interfaces. However, embodiments of the present disclosure are not so limited, and may be fabricated using other metals, as described further below. The structure of an RRAM device in accordance with the present disclosure is described with respect to FIG. 1, and corresponding fabrication methods in accordance with the present disclosure are described with respect to FIGS. 2-5.

The RRAM device 100 cross-section shown in FIG. 1 can include a substrate 102 having an oxide material (e.g., pad oxide) 104 formed thereon. The substrate 102 can be any physical material upon which a semiconductor device can be applied, such as silicon (Si) or materials similarly used in the art. A nitride (e.g., silicon nitride (SiN)) material 106 can be formed over the oxide material 104. An oxide material 108 can be formed over one portion of the SiN material 106, and a functional metal material 110 can be formed over another portion of the SiN material 106. The functional metal material 110 can be implemented for adhesion, stress relief, or other suitable functionality, such as a buried digit line (BDL), among others. A conducting metallic material 112 (e.g., Tungsten) can be formed over the functional metal material 110, with the conducting metallic material 112 and functional metal material 110 comprising a bottom electrode 113. The bottom electrode may also serve as a wordline of the memory array in various embodiments. An area 111 of SiN can be located between the oxide material 108 and the bottom electrode 113. A resistive element 117 can be formed over the conducting metallic material 112, the resistive element 117 including a first portion 116 (adjacent the conducting metallic material 112) and a second portion 118 (adjacent the first portion 116).

According to one or more embodiments of the present disclosure, the first portion 116 of the resistive element 117 can be formed of a conductive metallic material (e.g., Cu, TiN), and the second portion 118 of the resistive element 117 can be formed of an oxide of that conductive metallic material (e.g., CuOx, TiOxNy). For example, the first portion 116 of the resistive element 117 can be formed of TiN, and the second portion can be formed of TiON. Alternatively, the resistive element 117 can be formed to have a copper (Cu) first portion 116 and a copper oxide (CuOx) second portion 118. According to various embodiments, the first portion 116 is formed of a material including a metal (e.g., metal, a mixture including at least one metal as a metal nitride or metal silicide), and the second portion 118 is formed of an oxide metal oxide, for example, by oxidizing the material including a metal used to form the first portion. The first portion 116 can be formed from a noble metal, palladium, platinum, ruthenium, a metal nitride, or a combination thereof, and the second portion 118 is a corresponding oxide of the material of the first portion. Embodiments of the present disclosure are not strictly limited to aforementioned materials, and conducting components may be formed with other materials, as are appropriate for the application thereof. According to one or more embodiments, the resistive element is formed such that the first portion is a metal oxide, and the second portion can be a metal (e.g., corresponding metal).

As shown in FIG. 1, the resistive element 117 can be formed in a via 119 formed within an insulative material 114 (e.g., dielectric), the insulative material 114 being formed over the oxide material 108 and the conducting metallic material 112 of the first electrode. As used herein, being formed "over" some material can include being formed at least partially over that material. The insulative material 114 can be formed of SiN or oxide material, for example. As can be seen in FIG. 1, the via 119 is formed in the insulative material 114 such that the resistive element 117 will be in contact with the electrode (e.g., the conducting metallic material 112 of the bottom electrode 113).

The resistive element 117 can be formed by selectively filling the via with a metal material. A conformal metal fill can be used to fill the via 119 that is formed within the insulative material 114. The conformal metal fill (as well as application of other metal materials shown in the structure illustrated in FIG. 1) can be accomplished using atomic material deposition (ALD), physical vapor deposition (PVD), chemical vapor deposition (CVD), supercritical fluid deposition (SFD), or other applicable thin film processes for applying metals. Damascene processing can be used to apply, and remove, unwanted metal material as is discussed further below. According to some embodiments, the via can be filled from the bottom up with the metal material.

According to one or more embodiments, the RRAM device of the present disclosure can be fabricated to be a sub-40 nm device. As such, the via 119 can have a dimension indicated by the bracket in FIG. 1 (which can be a diameter, for example) of less than 40 nm. A sub-40 nm RRAM device can, for example, be fabricated with a via being approximately less than one-half to one-quarter of the device size. In various embodiments, the RRAM device of the present disclosure can be fabricated as a sub-20 nm device having a via 119 with a dimension indicated by the bracket in FIG. 1 of less than approximately 10 nm. In other embodiments, the RRAM device of the present disclosure can be fabricated as a sub-15 nm device having a via 119 with a dimension indicated by the bracket in FIG. 1 of less than approximately 5 nm. The allocation of the resistive element between the first portion and the second portion can be controlled by the process used to selectively oxidize the conformally filled metal in the via 119. For example, the conformally filled metal can be oxidized by exposure to a gas cluster ion beam (GCIB), or by a plasma oxidation at conditions selected to control the location of the metal-metal oxide interface within the via, such as a slot-plane-antenna (SPA) plasma oxidation process. According to various embodiments, selectively oxidizing the metal material within the via is accomplished at a temperature below which significant thermal oxidation of the metal occurs (e.g., at a relatively low temperature).

A top electrode 121 can be formed over the resistive element 117 and the insulative material 114 (within which the via 119 containing the resistive element 117 is formed), after the conformal metal fill is appropriately oxidized. Assuming an RRAM device 100 having a resistive element 117 formed with a TiN first portion 116 and a TiON second portion 118, the top electrode 121 can be formed of TiN 120 formed directly over the resistive element 117 and the insulative material 114. Tungsten 122 is formed over the TiN material 120, the TiN 120 and tungsten 122 comprising the second electrode 121.

According to one or more embodiments of the present disclosure, via 119 can have at least one dimension of less than 40 nm, and in some embodiments the RRAM device can be a sub-20 nm or sub-15 um device, with the via 119 having at least one dimension of less than one-half the dimension of the RRAM device. A conformal metal fill is used in forming the TiN first portion 116 and TiON second portion 118 of the resistive element 117. However, embodiments of the present disclosure are not limited to conformal metal fill involving a metal material that is subsequently oxided to form a metal-metal oxide interface. According to at least one embodiment, the orientations of the bottom 113 (e.g., first) and top 121 (e.g., second) electrodes, and the resistive element 117, are reversed from that shown in FIG. 1. That is, the second electrode is formed over the substrate. The resistive element can then be formed by depositing a metal (e.g., TiN), oxidizing it to form a metal oxide (e.g., TiON), followed by another deposition of the corresponding metal (e.g., TiN). The first electrode can be formed over the resistive element. The conducting metallic material 112 portion of the first electrode, and TiN 120 portions of the first and second electrodes respectively, are arranged to be adjacent to the resistive element 117.

As described with respect to the particular structure shown in FIG. 1, the resistive element of an RRAM device can be formed of a material that can provide more than one resistance state, such as metals, metal oxides (MOx), transition metal oxide (TMO), and metal nitrides, among others. The RRAM device may utilize a resistance transition characteristic by which resistance of the material varies according to a change in application of voltage and/or current.

A resistive element can have an active region that is formed of one or more materials that are electronically semiconducting (e.g., nominally electronically insulating) and also are weakly ionic conductor(s). Material(s) of the active region can be capable of hosting and transporting ions that act as dopants to control the flow of electrons through the material(s). Ionic transport may also be understood as the transport of the absence of a particular ion (e.g., ionic vacancies), similar to understanding electric current by the movement of "holes" representing the absence of an electron. That is, ionic vacancies appear to move in a direction opposite to that of the corresponding ions. An ion, or its vacancy, can be an ion acting as one of a either a cation or anion.

According to one previous approach, the active region of a resistive element can be formed by deposition of two discrete materials that differ in some initial characteristic (e.g., concentration of ionic vacancies). Operation of the resistive element can involve transport of ionic vacancies from the first portion, across a boundary between the two portions of the resistive element, to the material of the second portion. The active region thus comprises, for example, a primary material for transporting and hosting ions that act as dopants to control the flow of electrons, and a secondary material for providing a source of ionic dopants for the primary material.

Metals can be used in a variety of applications, including in semiconductor device applications. Certain material properties of metals (e.g., lower electrical resistivity, good electromigration performance, and increased stress migration resistance) are desired in semiconductor applications and can account for the use of metals in interconnect lines and contacts. The material properties of some metals, such as titanium (Ti) and copper (Cu), provide advantages over other metals, such as aluminum (Al). For example, lower electrical resistance can allow signals to move faster by reducing the RC time delay.

However, the introduction of metals (e.g., Cu) into multilevel metallization architectures of semiconductor devices can require specialized processing methods for metal patterning. Metals (e.g., Cu) can be difficult to dry etch. Therefore, process schemes have been developed for metal patterning, such as damascene processing. The damascene approach is based on etching features in the dielectric material, filling them with metal, and planarizing the top surface by chemical mechanical planarization (CMP). Dual damascene schemes integrate both the contacts and the interconnect lines into a single processing scheme.

Figure 2C:
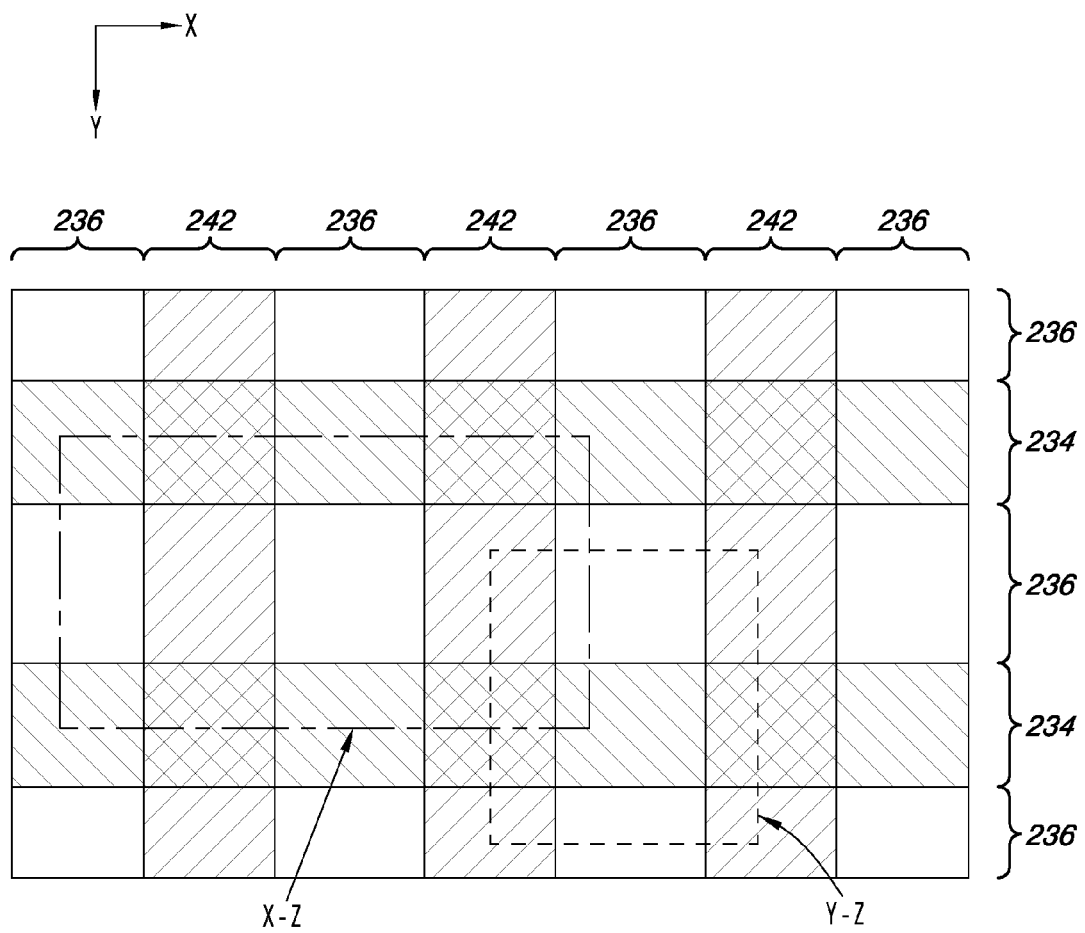
FIG. 2C illustrates a plan view of a semiconductor structure during the formation of an RRAM device using single damascene processing in accordance with one or more embodiments of the present disclosure.

FIGS. 2A and 2B illustrate a cross-sectional view of a structure during the formation of a RRAM device using single damascene processing in accordance with one or more embodiments of the present disclosure. FIG. 2C illustrates a plan view of a semiconductor structure during the formation of an RRAM device using single damascene processing in accordance with one or more embodiments of the present disclosure. FIG. 2A shows a cross-sectional view of a semiconductor structure 230 during the formation of a RRAM device in an X-Z plane at the location indicated in FIG. 2C (Z indicating a vertical axis in a 3-dimensional coordinate system), and FIG. 2B shows a cross-sectional view of a semiconductor structure 232 in a Y-Z plane at the location indicated in FIG. 2C. Note that FIG. 2C is not a horizontal slice of the RRAM device since the bit line conductors and word line conductors do not intersect in any common plane. Rather, FIG. 2C shows in plan view the orientation of both of the bit line conductors 242, word line conductors 234, and bit line dielectric 236 in order to indicate the locations and orient the views shown in each of FIGS. 2A and 2B simultaneously.

Semiconductor structures 230 and 232 show a bit line dielectric 236 formed over word line conductors 234 and word line dielectric material 238 (shown in FIG. 2B). Prior to arriving at the configurations shown in FIGS. 2A and 2B, the bit line dielectric 236 was patterned (e.g., vias formed therein) and a resistive cell stack material 240 conformally deposited therein. A metal material 242 forming the bit line conductors was subsequently deposited over the resistive cell stack material 240 to arrive at the structures 230 and 232 shown in FIGS. 2A and 2B respectively.

FIGS. 3A and 3B illustrate a cross-sectional view of a semiconductor structure during the formation of a RRAM device using single damascene processing after planarization to isolate a bit line in accordance with one or more embodiments of the present disclosure. FIG. 3A shows a cross-sectional view of semiconductor structure 330 during the formation of a RRAM device in the X-Z plane at a location and orientation with respect to the intersecting bit and word line conductors such as that indicated in FIG. 2C, and FIG. 3B shows a cross-sectional view of semiconductor structure 332 in the Y-Z plane at a location and orientation with respect to the intersecting bit and word line conductors such as that indicated in FIG. 2C.

Semiconductor structures 330 and 332 include components corresponding to like components shown in FIGS. 2A and 2B, including a bit line dielectric 336 formed over a word line conductor 334 and word line dielectric material 338 (shown in FIG. 3B), the bit line dielectric 336, resistive cell stack material 340, and the metal material 342 deposited over the resistive cell stack material 340. Structures 230 and 232 have been planarized (e.g., by CMP) to arrive at the structures 330 and 332 shown in FIGS. 3A and 3B respectively. As can be observed from FIGS. 3A and 3B, planarization has removed the volume of resistive cell stack material 340 and the metal material 342 deposited outside the vias. In this manner, planarization isolates the metal bit line and resistive cell stack material to containment wholly within the vias previously formed in the bit line dielectric 336. FIGS. 2 and 3 illustrate a single damascene processing case.

FIGS. 4A and 4B illustrate a cross-sectional view of a semiconductor structure during the formation of a RRAM device using dual damascene processing in accordance with one or more embodiments of the present disclosure. FIG. 4A shows a cross-sectional view of a semiconductor structure 460 during the formation of a RRAM device in the X-Z plane at a location and orientation with respect to the intersecting bit and word line conductors such as that indicated in FIG. 2C, and FIG. 4B shows a cross-sectional view of a semiconductor structure 462 in a Y-Z plane at a location and orientation with respect to the intersecting bit and word line conductors such as that indicated in FIG. 2C.

Semiconductor structures 460 and 462 are similar to structures 230 and 232 shown in FIGS. 2A and 2B, with the addition of an etch stop material 444. Semiconductor structures 460 and 462 include a bit line dielectric 436 formed over a word line conductor 434 and word line dielectric material 438 (shown in FIG. 4B). Prior to arriving at the configurations shown in FIGS. 4A and 4B, a lower portion of the hit line dielectric 436 was deposited, the etch stop material 444 was deposited over the lower portion of the bit line dielectric 436, with an upper portion of the bit line dielectric 436 being deposited over the etch stop material 444. The bit line dielectric 436 and etch stop material 444 "sandwich" was patterned to form vias therein, and remove the upper portion of the bit line dielectric 436 in selected locations over the etch stop material 444. A resistive cell stack material 440 was conformally deposited in the vias and over exposed portions of the etch stop material 444, with a metal material 442 being subsequently deposited over the resistive cell stack material 440 to arrive at the structures 460 and 462 shown in FIGS. 4A and 4B respectively.

Figures 5A, 5B:
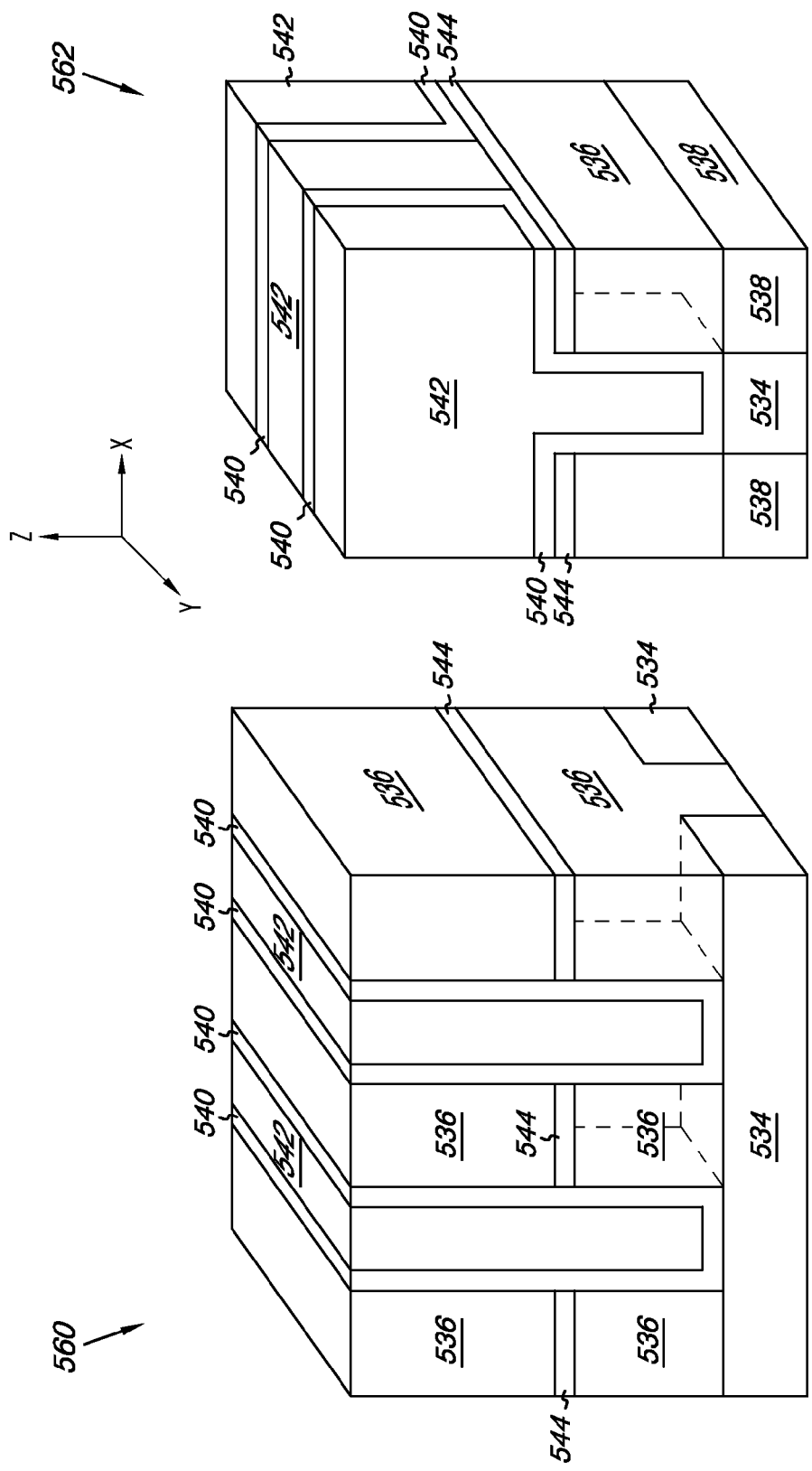
FIGS. 5A and 5B illustrate a cross-sectional view of a semiconductor structure during the formation of an RRAM device using dual damascene processing after planarization to isolate a bit line in accordance with one or more embodiments of the present disclosure.

FIGS. 5A and 5B illustrate a cross-sectional view of an semiconductor structure during the formation of a RRAM device using dual damascene processing after planarization to isolate a bit line in accordance with one or more embodiments of the present disclosure. FIG. 5A shows a cross-sectional view of semiconductor structure 560 during the formation of a RRAM device in the X-Z plane at a location and orientation with respect to the intersecting bit and word line conductors such as that indicated in FIG. 2C, and FIG. 5B shows a cross-sectional view of semiconductor structure 562 in the Y-Z plane at a location and orientation with respect to the intersecting bit and word line conductors such as that indicated in FIG. 2C.

Semiconductor structures 560 and 562 include components corresponding to like components shown in FIGS. 4A and 4B, including a bit line dielectric 536, having an intermediate etch stop material 544 located therein, formed over a word line conductor 534 and word line dielectric material 538 (shown in FIG. 5B), the bit line dielectric 536, resistive cell stack material 540, and the metal material 542 deposited over the resistive cell stack material 540. Structures 460 and 462, shown in FIGS. 4A and 4B, have been planarized (e.g., by CMP) to arrive at the structures 560 and 562 shown in FIGS. 5A and 5B respectively. As can be observed from FIGS. 5A and 5B, planarization has removed the volume of resistive cell stack material 540 and the metal material 542 deposited outside the vias. In this manner, planarization isolates the metal bit line and resistive cell stack material to containment wholly within the vias previously formed in the bit line dielectric 536. FIGS. 4 and 5 illustrate a dual damascene processing case due to the divided arrangement of the bit line dielectric 536 (e.g., the bit line dielectric 536 and etch stop material 544 "sandwich").

An alternative to the damascene approach contemplated by the present disclosure is a patterned etching of metal material. The patterned etch process involves deposition of a metal material over a substrate, the use of a patterned hard mask or photoresist over the metal material, patterned etching of the metal material using a reactive ion etching (RIE) process, and deposition of dielectric material over the patterned metal material. Patterned etching of metal can have advantages over damascene processes since it is easier to etch fine metal patterns and then deposit a dielectric material onto the metal pattern, than it is to get barrier materials and metal to adequately fill small feature openings in a dielectric film.

Gas, such a chlorine, has been used for etching metal material (e.g., Cu, Al). A chlorine-containing gas in a gas mixture that includes argon (Ar). To achieve anisotropic etching, $Cl_2$ is mixed with other chlorine-containing gases (e.g., $Cl_2$, HCl, $BCl_3$, $SiCl_4$, $CHCl_3$, $CCl_4$, and combinations thereof), since the use of $Cl_2$ alone results in isotropic etching. Etching of metal material using chlorine plasma involves physical sputtering of the metal material (e.g., $CuCl_x$) by energetic ions in the plasma. However, there are several drawbacks to this method. For example, etching rates with this method are very low and the sputtered metal material coats the chamber walls and this requires periodic cleaning of the chamber. Another drawback is encountered when high-aspect-ratio features are etched in chlorine plasma and the sputtered metal material products redeposit on the feature sidewalls where the effects of physical sputtering are reduced. Furthermore, when the process is carried out at elevated temperatures (>200.degree. C.) to increase the volatility of the metal material being etched, corrosion can occur due to accumulated etch residues on the surface. If these residues are not removed by a post-etch cleaning step, they can cause continuing corrosion of the metal even after the application of a protective material over the etched features.

One alternative for etching the metal material used to fabricate the resistive element 117 of the present disclosure with a gas (such as chlorine) is to planarize the metal material (e.g., chemically and/or mechanically). For example, CMP can be used to planarize the metal material used to form the resistive element 117 to within the via. That is, metal material that extends outside the via can be chemically and/or mechanically removed. Similarly, a semiconductor structure can be chemically and/or mechanically planarized to remove the metal material within a via, as well as some of the material forming the via such that the metal material within the via is substantially planar with the opening of the via. Single and dual damascene processing methods can be used in fabricating the RRAM devices of the present disclosure employing chemical and/or mechanical planarizing techniques, among others.

As mentioned above, selectively oxidizing the resistive element (e.g., 117 shown in FIG. 1) creates the second portion 118, and thus a metal-metal oxide interface 115 between the first portion 116 and the second portion 118 of the resistive element 117. Controlling the selective oxidation process with sufficient precision can thereby control the configuration of the resistive element, including the resistance, resistance ratio between at least two resistance states, and the physical dimensions of each of the first and second portions.

In one or more embodiments of the present disclosure, an RRAM device can be fabricated where the first 116 and second 118 portions of the resistive element 117 can be configured to provide a resistance that sufficiently limits current flow in its low resistance state (e.g., to achieve desired power usage levels and/or to remain within thermal limits). For example, one configuration of resistive element 117 provides at least 1000 ohms of resistance in its low-resistance state. Additionally, in various embodiments of this disclosure, an RRAM device can be formed where the first and second portions of the resistive element are configured to provide a resistance ratio on the order of 1000 using 3V programming pulses drawing approximately 1 mA and −2V erase pulses drawing less than 1.5 mA. That is, switching between two resistance states can result in a resistance change of approximately three orders of magnitude (e.g., from approximately 1,000 ohms to approximately 1,000,000 ohms). In some embodiments, an RRAM device can be formed where the first and second portions of the resistive element are configured to provide a resistance ratio on the order of 100 using 3V programming pulses drawing approximately 0.1 mA and −2V erase pulses drawing less than 0.3 mA. That is, switching between two resistance states at lower current magnitudes can result in a resistance change of approximately two orders of magnitude (e.g., from approximately 1,000 ohms to approximately 100,000 ohms).

According to one or more embodiments, the resistive element 117 can be formed in a via having at least one sub-40 nm dimension (e.g., width and/or diameter of the via). In some embodiments the resistive element 117 can be formed as part of a RRAM device (e.g., sub-20 nm device) in a via having at least one dimension of less 10 nm. In other embodiments the resistive element 117 can be formed as part of a RRAM device (e.g., sub-15 nm device) in a via having at least one dimension of less 5 nm. The resistive element can be formed completely contained in the via, either by occupying the entire volume of the via, or some portion thereof. That is, in some embodiments, conformal metal deposition can be made so as to not completely fill the via. CMP removal of metal material outside the via would result in the metal material being confined to the via, but recessed somewhat from the surface of the surrounding insulative material. The recessed metal can still be selectively oxidized, as previously described. Subsequent forming of the second electrode (e.g., the TiN portion), the second electrode material will extend into the via to be in contact with the recessed resistive element.

In other embodiments the resistive element be formed to extend outside the via. For example, at least one of the first and second portions can extend outside the via by a distance in the range of from about 10 Angstroms to about 50 Angstroms. As used herein, dimensions in the range of from about a first dimension to about a second dimension intend some embodiments of the present disclosure being in the range from the first dimension to the second dimension, among other additional embodiments. Again, the metal material of the resistive element can subsequently be selectively oxidized, and a second electrode formed over at least the resistive element. The TiN material of the second electrode will be conformally deposited around the second portion of the resistive element that extends outside the via.

Controlling the selective oxidation process of the metal conformally deposited within the via determines the allocation of via volume comprising the first and second portions of the resistive element respectively. According to some embodiments, the selective oxidation is controlled such that the second portion of the resistive element occupies less than about forty percent (40%) of the volume of the via. In some embodiments, the selective oxidation is controlled such that the second portion occupies less than about twenty-five percent (25%) of the distance between the first and second electrodes. As used herein, percentages stated as being about a given percentage intend some embodiments of the present disclosure being configured to have a characteristic of the given percentage, among other additional embodiments.

In various embodiments, the second portion of the resistive element (e.g., TiON) has a depth in the range of from about 10 Angstroms to about 100 Angstroms along the dimension of the via extending between the first and second electrodes. In some embodiments, the second portion of the resistive element (e.g., TiON) has a depth in the range of from about 20 Angstroms to about 80 Angstroms along the dimension of the via extending between the first and second electrodes.

According to one or more embodiments of the present disclosure, RRAM devices fabricated as described above can be used as memory cells of a memory array, the RRAM devices arranged in a cross-point configuration. Furthermore, the memory arrays so constructed can be incorporated into various electronic memories, computing devices, and other apparatus and computing systems.

Figure 6:
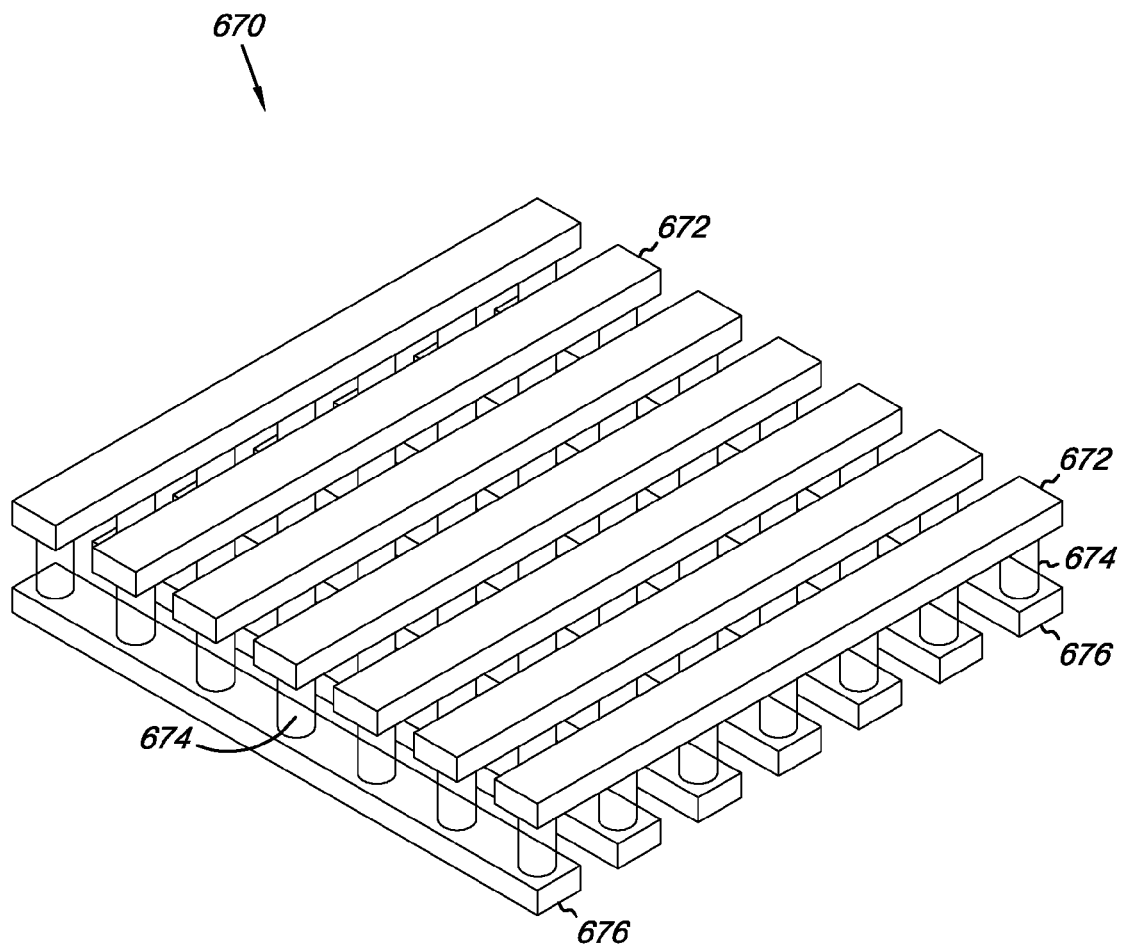
FIG. 6 is a perspective view of a cross point resistive memory array in accordance with one or more embodiments of the present disclosure.

FIG. 6 is a perspective view of a cross point resistive memory array in accordance with one or more embodiments of the present disclosure. The cross point resistive memory array 670 can include a plurality of bottom (i.e., first) electrodes 676 and a plurality of top (i.e., second) electrodes 676. The bottom electrodes 676 may be arranged parallel to each other in a first direction and the second electrodes 676 may be arranged parallel to each other in a first direction. The first and second directions may, but need not be, perpendicular to one another. However, the first and second directions can be oriented such that the bottom and top electrodes cross each other to establish a plurality of intersections (e.g., cross points) at which a resistive element 674 can be formed therebetween.

The top electrode 676 is similar to top electrode 121 shown in FIG. 1, and may be fabricated as previously described for top electrode 121. The bottom electrode 676 is similar to bottom electrode 113 shown in FIG. 1, and may be fabricated as previously described for bottom electrode 113. The resistive element 674 is similar to resistive element 117 shown in FIG. 1, and may be fabricated as previously described for resistive element 117 to include a metal portion and a metal oxide portion. For example, the cross point resistive memory array 670 can include a plurality of memory cells, each memory cell being an RRAM device fabricated as described with respect to FIG. 1. The locations and/or arrangement of the bottom (i.e., first) electrodes 676, the top (i.e., second) electrodes 676, and the resistive elements may be reversed, including reversal of the metal and metal oxide portions of the resistive element, as previously described.

The structures, circuits, and devices described above can be fabricated by automated systems, such as computer-controlled semiconductor fabrication equipment. For example, a non-transitory computer readable medium can have instructions stored thereon that are executable by a processor to cause an apparatus or device to perform the fabrication method(s) set forth herein. The instructions can, among other actions, cause the semiconductor fabrication equipment to deposit a first electrode over a substrate, deposit an insulative material over at least the first electrode, form a via in the insulative material, deposit a conformal material including a metal at least within the via, isolating the conformal material including the metal to within the via, selectively treat the material including the metal within the via to oxidize a portion of the material including the metal, and deposit a second electrode over the oxidized portion of the material including the metal.

Devices, methods, and systems for forming RRAM devices, and in particular, metal material processing to create a metal-metal oxide interface that can be operated to switch between two or more resistance states, have been described herein. Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method of forming a resistive random access memory (RRAM) device, comprising:
    forming a first oxide material over a substrate;
    forming a silicon nitride material over the first oxide material;
    forming a second oxide material over a portion of the silicon nitride material;
    forming a first electrode over a different portion of the silicon nitride material;
    forming a resistive element over the first electrode, where forming the resistive element includes:
        forming an insulative material over the second oxide material and the first electrode;
        forming a via in the insulative material over the first electrode;
        filling the via with a metal material; and
        selectively treating a portion of the metal material within the via to create a metal-metal oxide interface within the via; and
    forming a second electrode over the resistive element and the insulative material.

2. The method of claim 1, further comprising planarizing the metal material to within the via, wherein filling the via with the metal material includes conformally filling the via with the metal material, and wherein selectively treating the metal material within the via includes selectively oxidizing the portion of the metal material.

3. The method of claim 2, wherein selectively oxidizing the portion of the metal material within the via is accomplished at a temperature below which thermal oxidation occurs.

4. The method of claim 3, wherein selectively oxidizing the portion of the metal material within the via includes plasma oxidation.

5. The method of claim 2, wherein selectively oxidizing the portion of the metal material within the via includes a slot-plane-antenna (SPA) plasma oxidation process.

6. The method of claim 1, wherein selectively treating the metal material within the via includes selectively exposing the portion of the metal material within the via to a gas cluster ion beam (GCIB).

7. The method of claim 1, wherein filling the via with the metal material includes conformally filling the via with TiN.

8. The method of claim 7, wherein selectively treating the portion of the metal material within the via creates a TiN—TiON interface within the via.

9. The method of claim 1, wherein filling the via with the metal material includes conformally filling the via with copper.

10. The method of claim 9, wherein selectively treating the portion of the metal material within the via creates a Cu—CuOx interface.

11. The method of claim 10, wherein filling the via with the metal material includes conformally filling the via using atomic layer deposition (ALD) of the metal material.

12. The method of claim 1, wherein filling the via with the metal material includes conformally filling the via using atomic layer deposition (ALD) of the metal material.

13. The method of claim 1, wherein filling the via with the metal material includes conformally filling the via using physical vapor deposition (PVD) of the metal material.

14. The method of claim 1, wherein filling the via with the metal material includes conformally filling the via using chemical vapor deposition (CVD) of the metal material.

15. The method of claim 1, wherein filling the via with the metal material includes conformally filling the via using supercritical fluid deposition (SFD) of the metal material.

16. The method of claim 1, wherein forming the resistive element includes fabricating the metal material within the via by damascene processing.

17. The method of claim 16, wherein damascene processing includes single damascene processing.

18. The method of claim 16, wherein damascene processing includes dual damascene processing.

19. The method of claim 16, wherein filling the via with the metal material includes conformally filling the via by selectively filling the via with the metal material.

20. The method of claim 16, wherein filling the via with the metal material includes conformally filling the via by bottom up filling the via with the metal material.

* * * * *